(12) United States Patent
Henke et al.

(10) Patent No.: US 7,305,999 B2
(45) Date of Patent: Dec. 11, 2007

(54) CENTRIFUGAL SPRAY PROCESSOR AND RETROFIT KIT

(75) Inventors: Trevor Henke, Vernon (GB); Craig Meuchel, Great Wilbrham (GB); Marvin Bernt, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 383 days.

(21) Appl. No.: 10/199,998

(22) Filed: Jul. 19, 2002

(65) Prior Publication Data

US 2003/0102019 A1    Jun. 5, 2003

(51) Int. Cl.
*B08B 3/02*  (2006.01)

(52) U.S. Cl. .................. 134/147; 134/153; 134/198; 134/901

(58) Field of Classification Search ............... 134/198, 134/147, 153, 148, 902, 200; 156/345.11–345.23
See application file for complete search history.

(56) References Cited

U.S. PATENT DOCUMENTS

| | | | | |
|---|---|---|---|---|
| 1,999,814 A | * | 4/1935 | Knight | 426/481 |
| 2,565,798 A | * | 8/1951 | Borzell et al. | 134/103.2 |
| 3,021,972 A | * | 2/1962 | Everroad | 414/433 |
| 3,088,391 A | * | 5/1963 | Sigler | 134/58 R |
| 3,323,528 A | * | 6/1967 | Link | 134/57 R |
| 3,348,557 A | * | 10/1967 | Adamson | 134/113 |
| 3,351,077 A | * | 11/1967 | Hoornstra | 134/147 |
| 3,442,273 A | * | 5/1969 | Hanish et al. | 134/100.1 |
| 3,598,130 A | * | 8/1971 | Nolte et al. | 134/102.1 |
| 3,620,234 A | * | 11/1971 | Everroad | 134/86 |
| 3,630,804 A | * | 12/1971 | Coffman et al. | 156/345.21 |
| 3,688,780 A | * | 9/1972 | Everroad | 134/21 |
| 3,718,983 A | * | 3/1973 | Crowell | 34/637 |
| 3,727,536 A | * | 4/1973 | Bunker | 396/609 |
| 3,771,776 A | * | 11/1973 | Kogl | 134/148 |
| 3,812,514 A | * | 5/1974 | Watabe | 396/609 |
| 3,930,513 A | * | 1/1976 | Buchegger et al. | 134/172 |
| 3,990,462 A | * | 11/1976 | Elftmann et al. | 134/102.1 |
| 4,132,567 A | * | 1/1979 | Blackwood | 134/1 |
| 4,197,000 A | * | 4/1980 | Blackwood | 396/625 |
| 4,299,245 A | * | 11/1981 | Clapper | 134/140 |
| 4,697,292 A | * | 10/1987 | LaValley | 8/156 |
| 4,786,522 A | * | 11/1988 | Fukuta et al. | 427/575 |
| 4,900,395 A | * | 2/1990 | Syverson et al. | 438/706 |
| 4,961,373 A | * | 10/1990 | Milone | 99/355 |
| 5,000,206 A | * | 3/1991 | Kramer et al. | 134/34 |
| 5,067,193 A | * | 11/1991 | Thomas | 15/88.3 |
| 5,378,308 A | * | 1/1995 | Thoms | 216/92 |
| 5,384,045 A | * | 1/1995 | Chmielewski et al. | 210/354 |
| 5,435,075 A | * | 7/1995 | Shiraishi et al. | 34/58 |

(Continued)

FOREIGN PATENT DOCUMENTS

JP    63-185032    *    7/1988

(Continued)

*Primary Examiner*—Frankie L. Stinson
(74) *Attorney, Agent, or Firm*—Perkins Coie LLP

(57) ABSTRACT

A centrifugal spray processor for processing semiconductor wafers uses larger numbers of spray nozzles. Each spray nozzle delivers a reduced volume of liquid, to reduce consumption of liquid process chemicals. The nozzles operate at a higher back pressure. The increased number of nozzles, offset nozzle patterns and groupings of nozzles, lower nozzle flow rates, and higher nozzle back pressures, provide improved processing results. The improved spray system may be provided as a retrofit kit.

24 Claims, 6 Drawing Sheets

U.S. PATENT DOCUMENTS

| | | | | |
|---|---|---|---|---|
| 5,505,220 A | * | 4/1996 | Gorecki | 134/138 |
| 5,672,212 A | * | 9/1997 | Manos | 134/1.3 |
| 5,762,084 A | * | 6/1998 | Krusell et al. | 134/184 |
| 5,791,357 A | * | 8/1998 | Hasegawa | 134/137 |
| 5,884,640 A | * | 3/1999 | Fishkin et al. | 134/95.2 |
| 5,927,302 A | * | 7/1999 | Hayami et al. | 134/89 |
| 5,938,808 A | * | 8/1999 | McMaster et al. | 65/114 |
| 5,962,070 A | * | 10/1999 | Mitsuhashi et al. | 427/240 |
| 5,992,431 A | * | 11/1999 | Weber et al. | 134/135 |
| 6,139,406 A | * | 10/2000 | Kennedy et al. | 451/67 |
| 6,199,568 B1 | * | 3/2001 | Arai et al. | 134/186 |
| 6,235,147 B1 | * | 5/2001 | Lee et al. | 156/345.21 |
| 6,235,641 B1 | * | 5/2001 | Christenson | 438/706 |
| 6,238,107 B1 | * | 5/2001 | Inada | 396/604 |
| 6,279,590 B1 | * | 8/2001 | Okuda et al. | 134/186 |
| 6,319,098 B1 | * | 11/2001 | Osterheld et al. | 451/54 |
| 6,322,009 B1 | * | 11/2001 | Subramanian et al. | 239/548 |
| 6,416,587 B1 | * | 7/2002 | Lu et al. | 134/2 |
| 6,418,945 B1 | | 7/2002 | Thompson et al. | |
| 6,491,046 B2 | * | 12/2002 | Liang | 134/111 |
| 6,589,359 B2 | * | 7/2003 | Kamikawa et al. | 134/26 |
| 6,672,319 B2 | * | 1/2004 | Dunn | 134/155 |
| 6,758,938 B1 | * | 7/2004 | Torek et al. | 156/345.11 |
| 6,797,076 B1 | * | 9/2004 | Bryer | 134/33 |
| 2002/0000240 A1 | | 1/2002 | Kamikawa | |
| 2002/0029789 A1 | * | 3/2002 | Egashira et al. | 134/2 |
| 2002/0053355 A1 | | 5/2002 | Kamikawa et al. | |
| 2002/0166569 A1 | * | 11/2002 | Harvey et al. | 134/1.3 |

FOREIGN PATENT DOCUMENTS

| | | | |
|---|---|---|---|
| JP | 6-326072 | * | 11/1994 |
| JP | 10-209114 | * | 8/1998 |
| JP | 11-128650 | * | 5/1999 |
| SU | 1424178 | * | 9/1990 |

* cited by examiner

CENTRIFUGAL SPRAY PROCESSOR AND RETROFIT KIT

BACKGROUND OF THE INVENTION

The field of the invention is manufacturing semiconductor devices. More specifically, the invention relates to apparatus and methods for processing flat media, typically semiconductor material wafers.

Semiconductor devices, such as microprocessor chips, memory chips, and a large number of other similar devices are generally manufactured from wafers, or thin round disks, of a semiconductor material such as silicon. The wafers undergo a large number of manufacturing steps, including cleaning steps, typically performed by rinsing and drying, as well as other processing steps where various chemicals in the form of liquids and/or gases are applied to the wafers.

Centrifugal processing has been used for many years, to perform certain steps in the manufacturing of semiconductor devices. Centrifugal processing is generally carried out in a centrifugal processor having a rotor for holding the wafers within a process chamber. Spray manifolds spray process liquids or gases onto the wafers. The rotor is rotated at high speed, at certain times during the centrifugal processing. This rotation of the wafers provides more uniform distribution of the process chemicals onto the wafers, as well as removal of liquid chemicals from the wafers, via centrifugal force.

Centrifugal processing may also be used with other devices manufactured from or on a flat substrate. These devices include photomasks and other optical devices, memory disks and media, and similar substrates. These various flat media are collectively referred to here as "wafers".

Wafers are manufactured in a highly specialized factory or fabrication facility known as a "fab". Due to the extremely high costs of building and operating the fab, manufacturing efficiency or throughput of wafers is very important. As a result, there is a need for machines and methods for providing faster or more efficient wafer processing.

Accordingly, it is an object of the invention to provide improved apparatus and methods for centrifugally processing semiconductor wafers.

SUMMARY OF THE INVENTION

In a first aspect of the invention, a wafer processing machine includes a rotor within a process chamber. First and second arrays of spray nozzles in the chamber are adapted to spray fluids towards the rotor. The second array of spray nozzles is radially and longitudinally offset from the first array of spray nozzles. As a result, the first and second arrays of spray nozzles provide overlapping spray patterns, which improve cleaning or processing of the wafers.

In a second aspect of the invention, the fluid back-pressure at the nozzles is increased. This produces a more vigorous and uniform spray pattern. The increase in back pressure at the spray nozzles may be achieved by increasing the size of liquid supply line components, including the supply line, hose, or piping, and valves. The orifice of the spray nozzle is reduced. Consequently, although far more nozzles are used, the increase in fluid consumption is minimal, although process results are significantly improved.

In a third aspect of the invention, existing spray processing machines are provided with a retrofit kit, including a process chamber having spray manifolds with radially and longitudinally offset spray nozzles, and a fluid supply system for providing increased back pressure at the spray nozzles.

In a fourth aspect of the invention, spray manifolds are provided on a process chamber of a centrifugal spray processing machine, with the manifolds having an increased number of nozzles, and smaller nozzle orifice sizes. The ratio of nozzles in each spray manifold to wafers is from 3:5 to 1:1. Enhanced spray patterns are achieved resulting in more uniform fluid flow across the wafers. Contaminant particle counts are reduced while etched uniformity and yield is increased. The improved spray system may also be used on stationary wafers in non-spin spray processors.

Other objects, features and advantages will appear below. The invention resides as well in sub-combinations of the components and features described.

BRIEF DESCRIPTION OF THE DRAWINGS

In the drawings, wherein the same reference number indicates the same element, throughout each of the views:

FIG. 4 also shows a process chamber which may be provided as a retrofit kit.

DETAILED DESCRIPTION OF THE DRAWINGS

Figure 2:
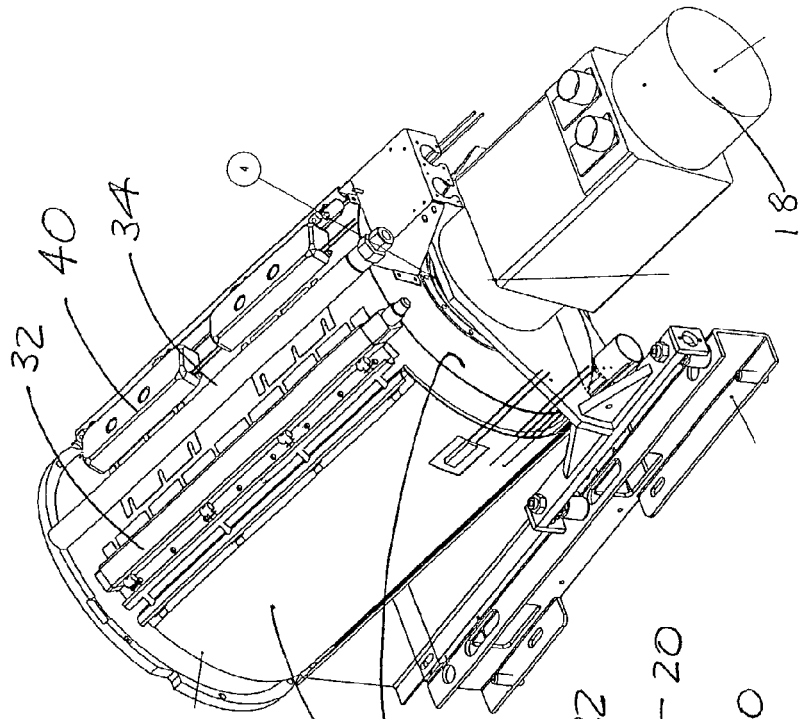
FIG. 2 is a rear and right side perspective view of the machine shown in FIG. 1.
Figure 1:
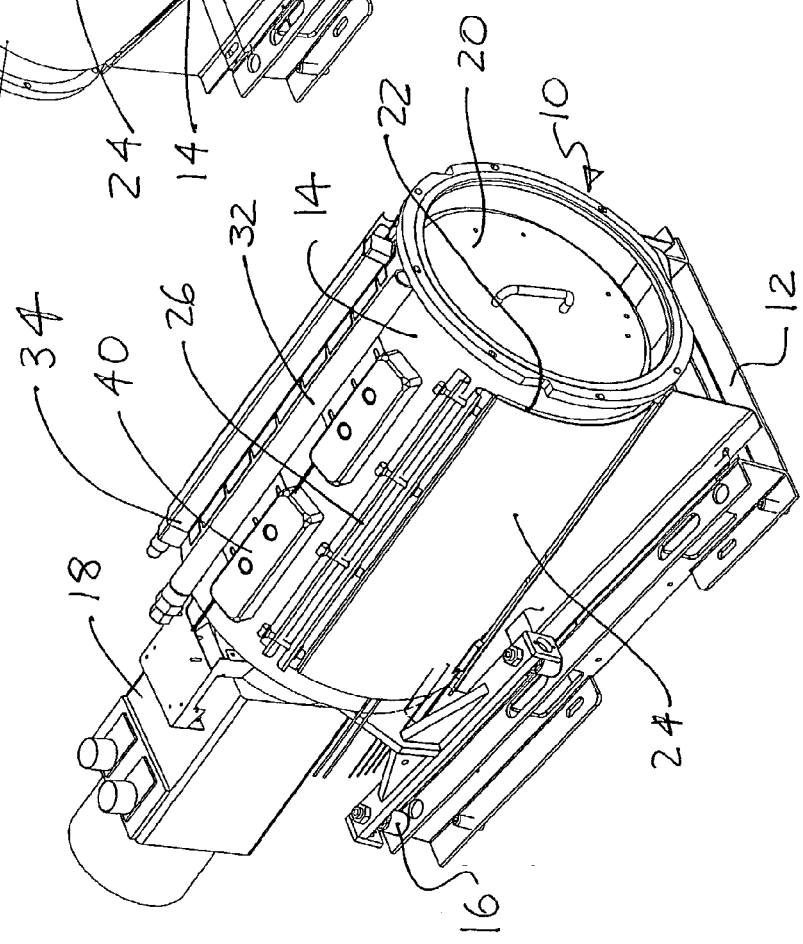
FIG. 1 is a front and left side perspective view of the present centrifugal spray processor machine.

Turning now to the drawings, as shown in FIGS. 1 and 2, a centrifugal spray processor 10 has a chamber or bowl 14 supported through vibration isolators 16 on a base 12. Blanket heaters 22 are held against the cylindrical side walls of the chamber 14 by heater cover plates 24 attached tot the chamber 14 by cover brackets 26. A removable or pivotable door 20 is provided to close off the open front end of the chamber 14, during processing. First and second spray manifolds 32 and 34 extend from the front to the back of the chamber 14, and are generally parallel to the axis of the cylindrical chamber 14. Static charge suppressors 40 are also provided on or in the chamber 14. The process chamber 14 is inclined upwardly at an angle of, for example, 5-30 degrees. and preferably about 10 degrees, so that the front end 45 of the process chamber 14 is higher than the back end.

Figure 3:
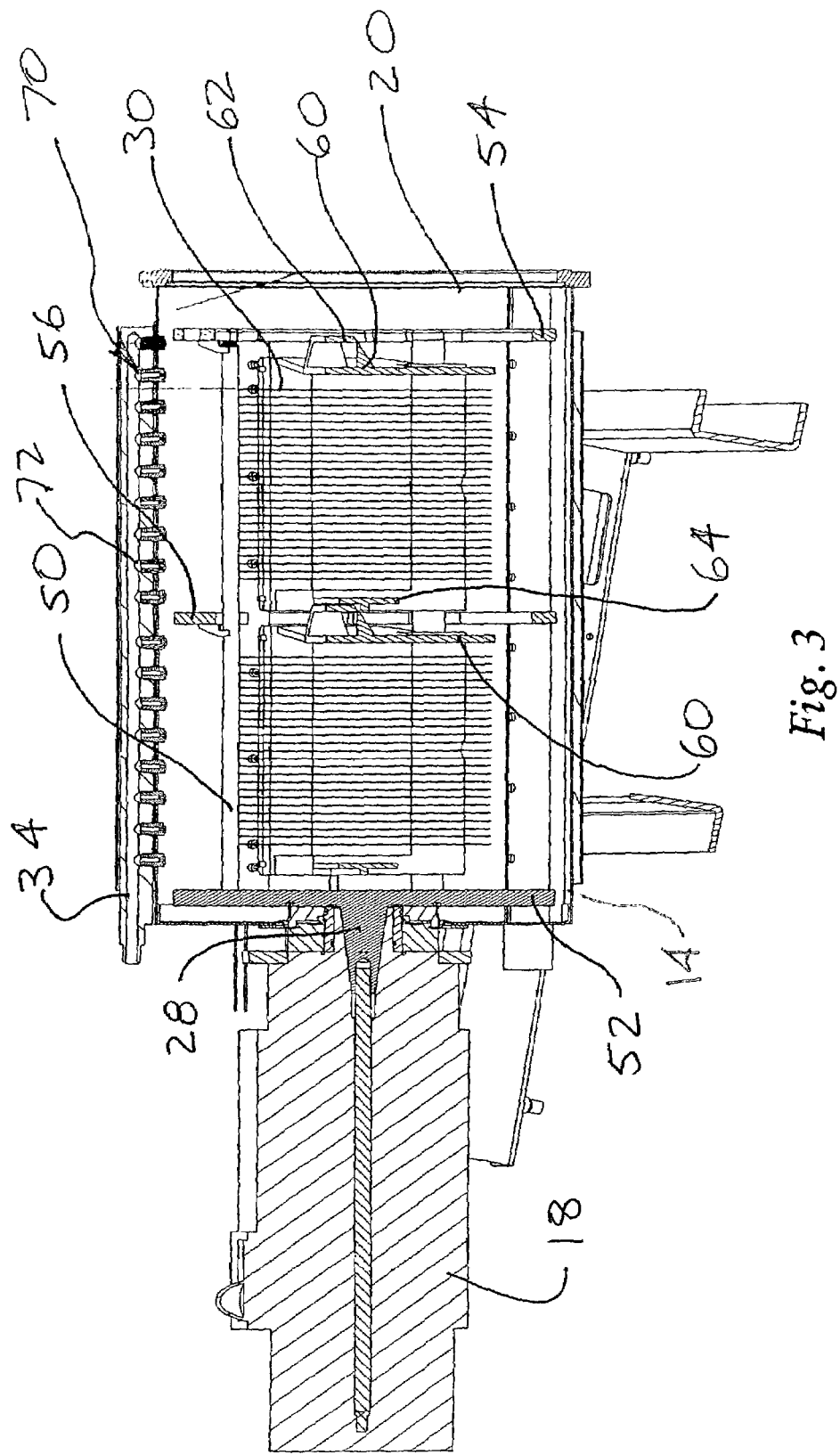
FIG. 3 is a section view of the machine shown in FIGS. 1 and 2.

Referring to FIG. 3, wafers or work pieces 30 are contained within cassettes 60 loaded into a rotor 50, as described in U.S. Pat. No. 6,418,945, incorporated herein by reference. A motor 18 behind the chamber 14 is connected to the rotor 50, with the rotor 50 cantilevered at a rear support fitting 28. The rotor 50 has a front ring or plate 54, a rear ring or plate 52 and optionally a center ring or plate 56 joined by spaced-apart longitudinal ribs 58. As shown in FIG. 3, with the cassettes 60 loaded into the rotor 50, the front handle 62 of the rear cassette contacts the back surface 64 of the front cassette.

Figure 4:
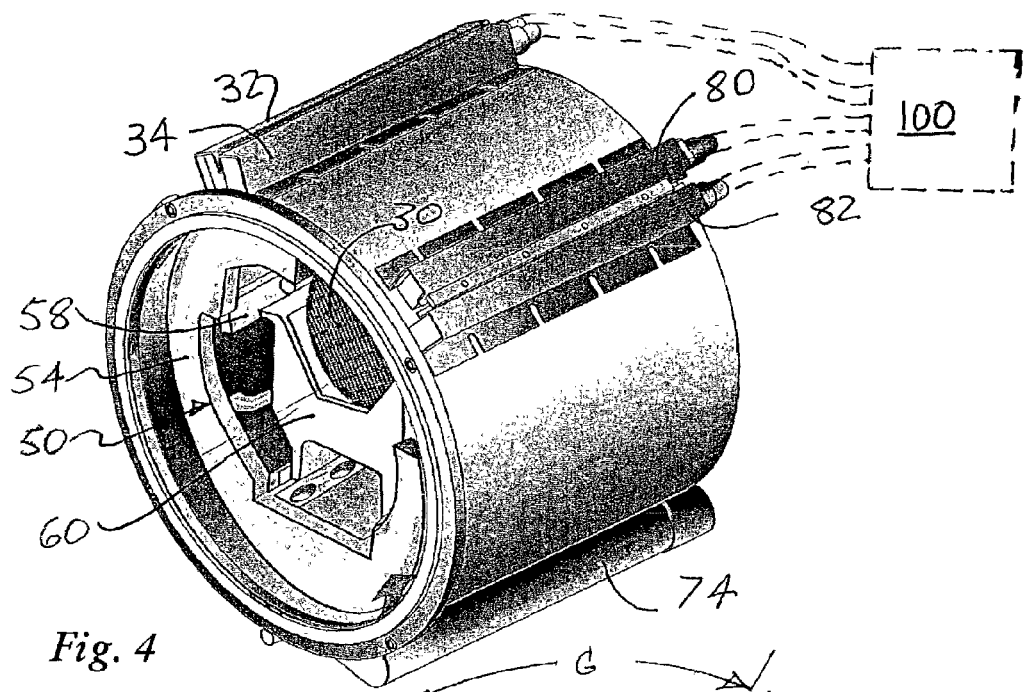
FIG. 4 is a perspective view of the process chamber shown in FIGS. 1-3, with the door removed, to show wafers within a cassette supported in a rotor within the process chamber.
Figure 5:
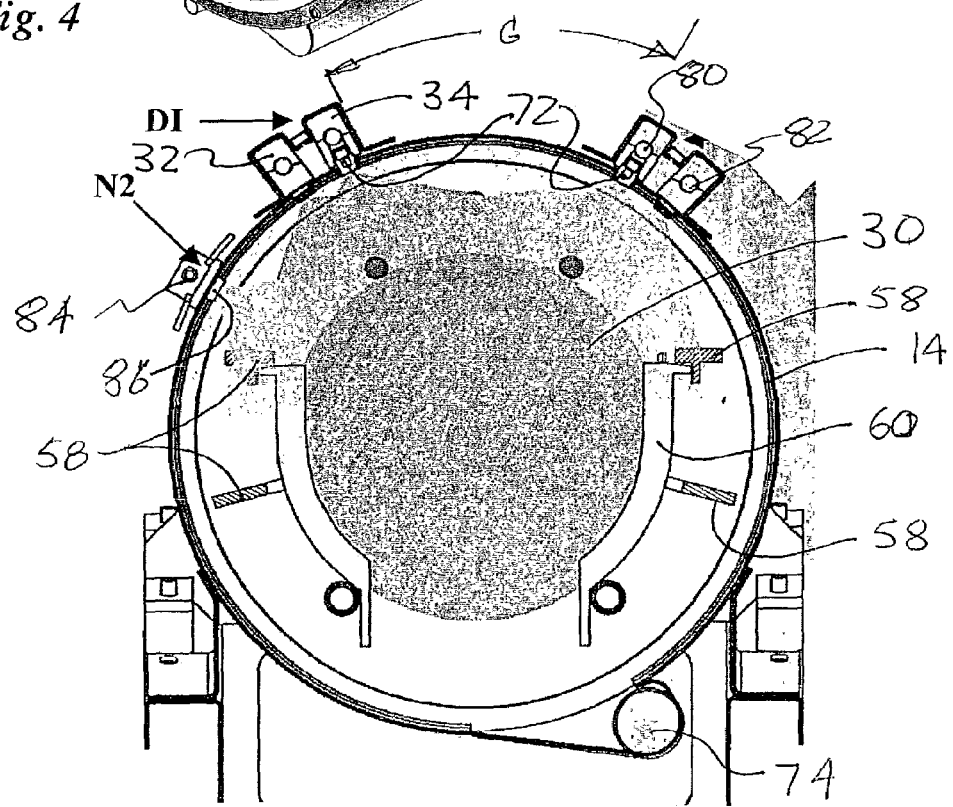
FIG. 5 is a section view of the process chamber shown in FIG. 4.
Figure 9:
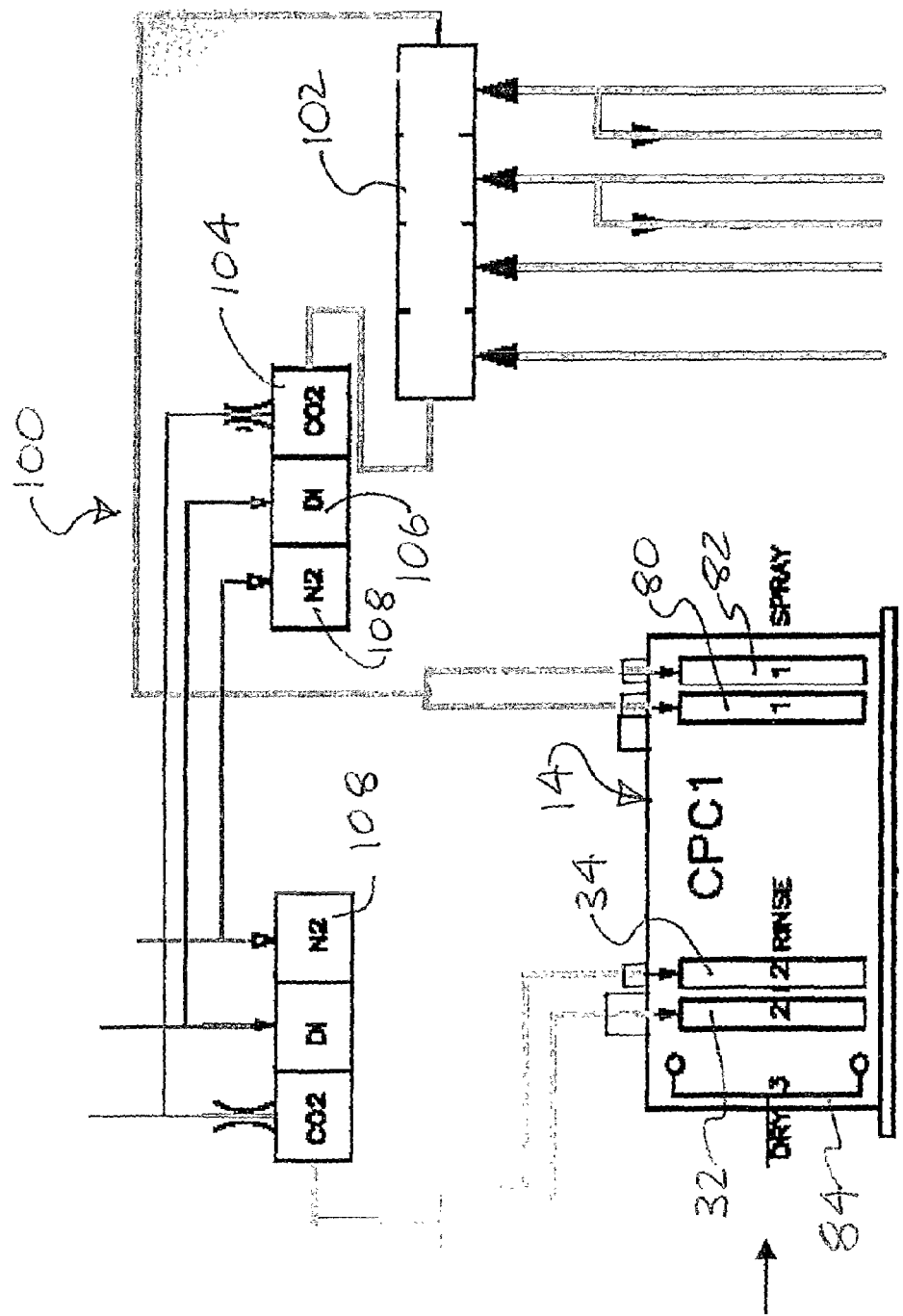
FIG. 9 is a schematic illustration of the fluid supply system shown in FIG. 4.

Referring now to the embodiment of FIG. 4, a third manifold 80 and a fourth manifold 82 are provided on or in the chamber 14, in addition to the first and second manifolds 32 and 34. While the first and second manifolds, and the third and fourth manifolds are clustered together, the second and third manifold are separated by an angle G of 50-90, 60-80 or about 70°. The manifolds 32, 34, 80 and 82 are connected to a fluid supply system 100, as schematically shown in FIG. 9. A gas or nitrogen manifold 84 having gas spray nozzles 86 is connected to a gas supply. A drain 74 adjacent to the bottom surface of the chamber 14 is provided to collect and drain off liquids.

Figure 6:
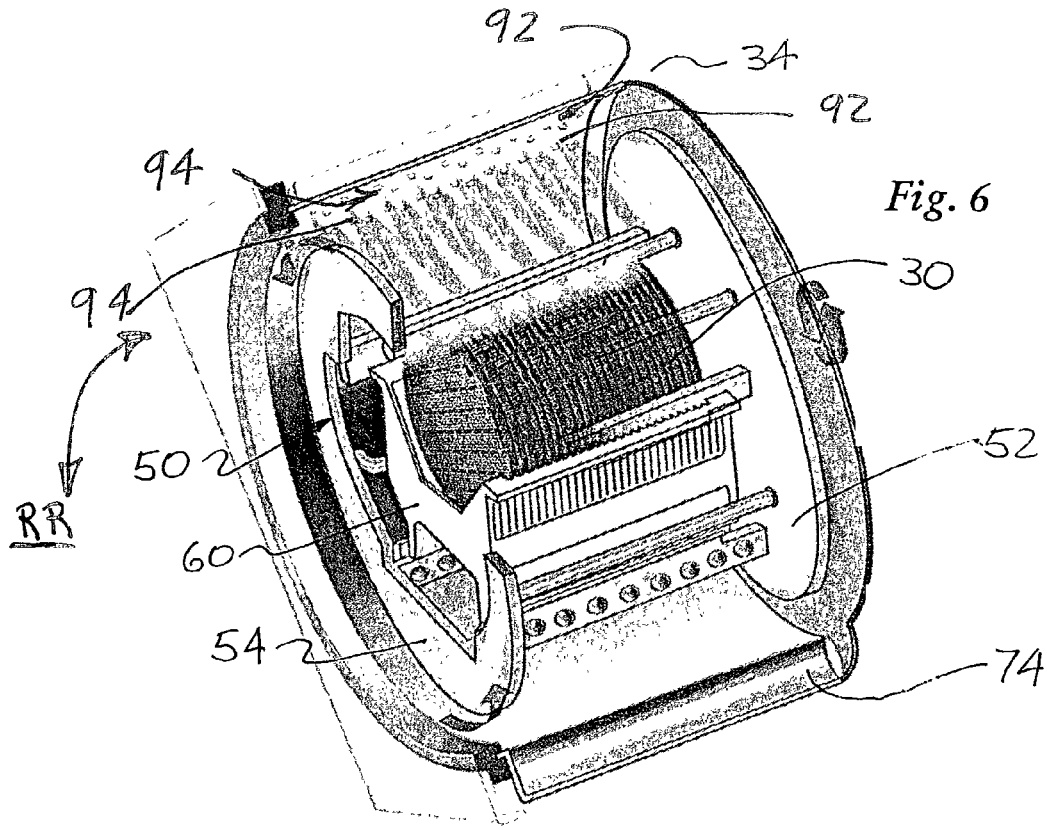
FIG. 6 is a cutaway perspective view of the process chamber shown in FIG. 4.
Figure 7:
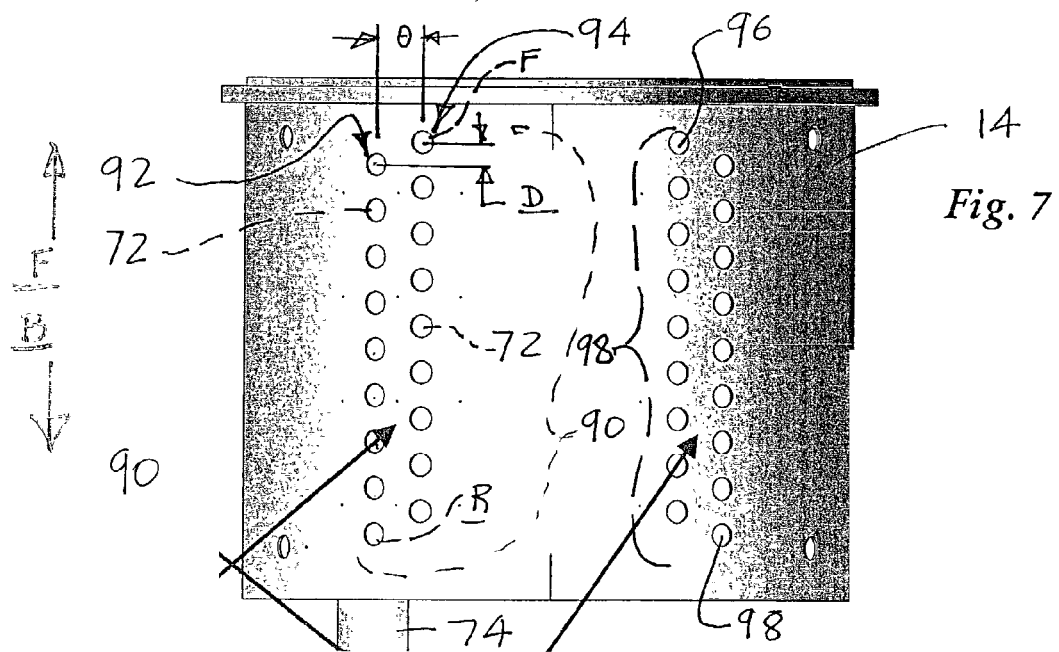
FIG. 7 is a plan view of the process chamber shown in FIG. 4, with the manifolds removed, to show the positions of the nozzles in the chamber via the nozzle hole patterns.

Referring now to FIGS. 6 and 7, the hole pattern shown through the cylindrical side wall of the chamber 14 indicates the locations of the liquid spray nozzles 72 of the first, second, third and fourth spray manifolds 32, 34, 80 and 82. As shown in FIG. 7, the liquid spray nozzles 72 on each of the manifolds 32, 34, 80 and 82 are aligned in a row, such as rows 92 and 94 indicating the locations of nozzles on the manifolds 80 and 82. The nozzles 72 of the third and fourth manifolds 80 and 82 are spaced apart (radially or along the circumference of the chamber) by a small angular distance of 5-30, 5-20 or 5-15 degrees. The nozzles 72 in the adjacent manifolds 80 and 82 are longitudinally staggered or offset (in the front to back direction F-B). As shown in FIG. 7, the first nozzle 72 on manifold 82 is generally halfway between the first and second nozzles of the manifold 80. The dimension D in FIG. 7 is approximately ½ of the distance between centers of adjacent nozzles 72 within each row 92 or 94.

The rows of nozzles 72 extend substantially from the front end of the chamber 14 to the back end of the chamber 14. Optionally, within each group 90 of nozzles 72 (made up of the nozzles of the third and fourth manifolds 80 and 82, or of the first and second manifolds 32 and 34) the nozzle closest to the front of the chamber, indicated by F in FIG. 7 is preferably positioned to also spray liquid towards the back surface of the door 20. Similarly, the nozzle 72 closest to the rear of the chamber 14, designated R in FIG. 7, is positioned to spray liquid onto the back ring or plate of the rotor. The nozzle locations indicated by the pattern 98 in FIG. 7 is the same as, or a mirror image of, the pattern 90, as described above. In the embodiment shown, each of the liquid spray manifolds has nine nozzles, for a total of 18 nozzles within each pattern, and a total of 36 nozzles on all four of the liquid spray manifolds. The number of nozzles on each manifold may vary with different applications and process chemicals. In the embodiment shown in FIG. 6, there are four rows of nozzles in a single pattern 90. This can be achieved via four separate manifolds, or via two split manifolds, i.e., a manifold having radially spaced apart rows of nozzles (spaced radially apart along direction R in FIG. 6).

Figure 8:
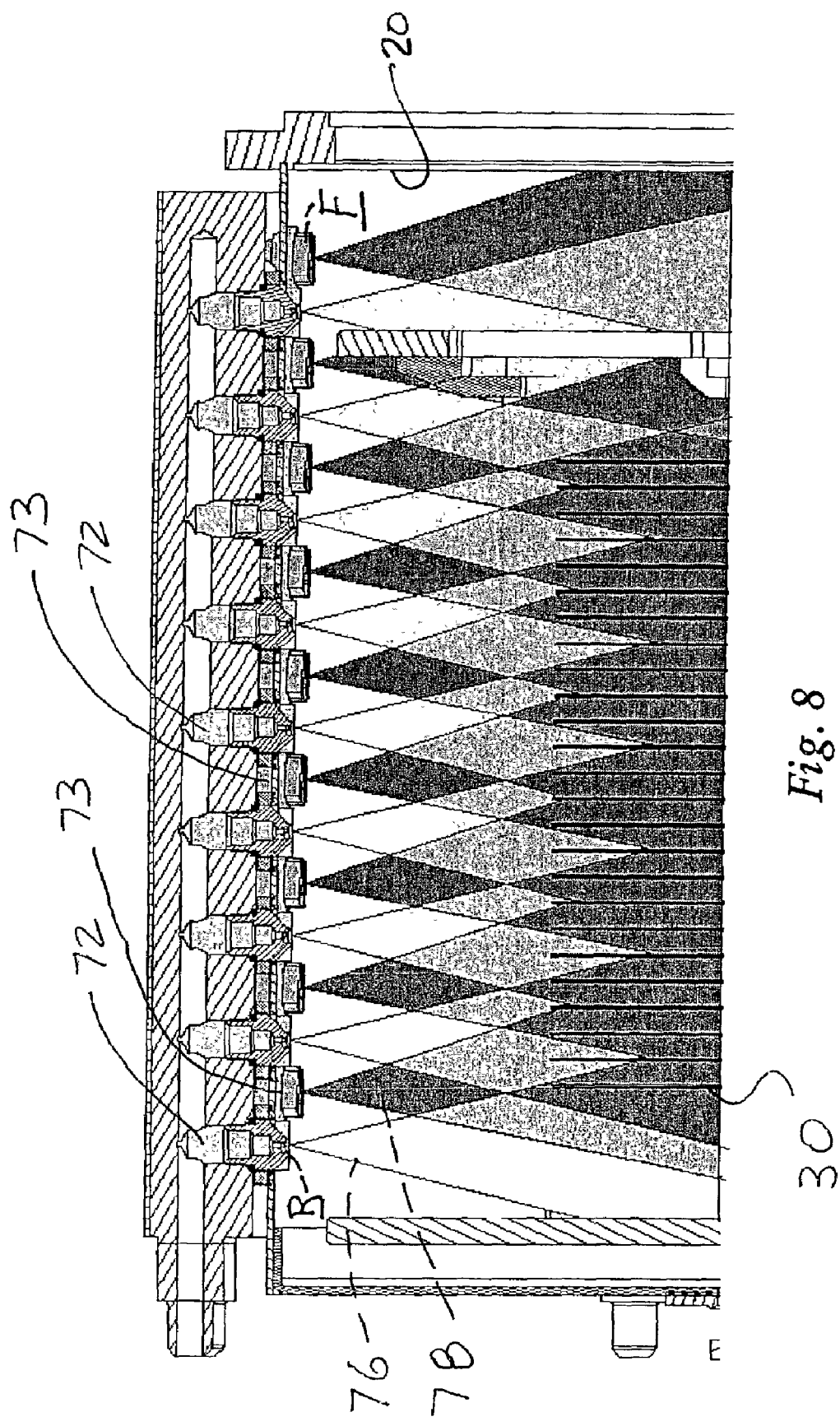
FIG. 8 is a schematic illustration of the spray patterns produced in the chamber shown in FIG. 4.

FIG. 8 illustrates the overlapping spray patterns provided by the nozzles 72 on the manifolds 32 and 34, or 80 and 82. As shown, the spray emitted from the nozzles 72 on the first or third spray manifolds overlaps with the spray emitted from the nozzles 73 on the second or fourth manifolds.

FIGS. 4-8 show an embodiment having a chamber and rotor for holding a single cassette carrying 25 wafers. As shown in FIG. 8, the ratio of liquid spray nozzles to wafers is 18:25. In general, the ratio of nozzles in each group 90 or 98 is preferably in the range of 3:5-1:1 or greater. The nozzles within a group 90 or 98 have common plumbing connections and simultaneously spray the same liquid. Each group 90 or 98 preferably has two rows of radially and longitudinally offset nozzles. The description of nozzle to wafer ratios here refers to the number of nozzles in a group, and not to the total number of nozzles in the chamber. Due to the geometry of the overlapping spray patterns, each wafer 30 is sprayed on both sides by at least two nozzles. FIG. 8 also shows the most forward nozzle at F spraying against the door, and the rearmost nozzle at R spraying against the back end of the rotor 50. The nozzles 72 are also preferably oriented with 20-40, 25-35 or 30 degree clocking into the direction RR of rotation of the rotor. Of course, chambers of different sizes or lengths will have different numbers of nozzles.

In comparison to existing centrifugal spray processors, the processor 10 has many more spray nozzles. To avoid excessive consumption of process liquids, the nozzles have a smaller orifice resulting in a reduced flow rate at standard back pressure, in the range of 0.06-0.14, 0.8-0.12 or 0.1 gallon/minute of flow. This flow rate is about one half of the flow rate typically used in centrifugal spray processors. In addition, back pressure at the nozzles is increased by increasing the liquid supply lines and valves (the increase nominally going from a ⅜ valve to a ⅝ inch valve, with fluid back pressures at the nozzles nominally doubled from about 25 to about 50 psi).

Referring to FIG. 9, the fluid supply system 100 includes a liquid chemical source or tank 102 connected to manifolds 80 and 82. A DI-water (de-ionized water) tank or source 106 is connected to manifolds 32 and 34. A nitrogen supply 108 and a carbon dioxide supply 104 are shown is connected to the gas spray manifold 84.

In use, one or more cassettes 60 holding wafers 30 is loaded into the rotor 50, as shown in FIGS. 3 and 4. The door 20 is closed. The motor 18 is turned on, spinning the rotor 50 and wafers 30. The process chemical, such as a solvent or acid, is typically supplied to the manifolds 80 and 82. The liquid chemical is sprayed out onto the spinning wafers 30, in a pattern as shown in FIG. 8. After a predetermined interval, delivery of the liquid chemical is stopped. While the rotor 50 continues to spin, DI-water is sprayed onto the wafers 30 from the manifolds 32 and 34, which may also produce a spray pattern as shown in FIG. 8. A gas, such as nitrogen, is then supplied to the manifolds to purge liquid from the manifolds (with the chemical spray manifolds 80 and 82 preferably purged before rinsing with di-water). During these steps, the rotor 50 may stop and reverse direction, or change speeds. After rinsing, the wafers 30 are dried by a high-speed rotation, and by spraying a drying gas, such as heated nitrogen.

Test results show that use of a relatively large number of nozzles in the ratios described, with each nozzle delivering proportionally less fluid, and with the nozzles operating at significantly increased back pressures, improved processing results are obtained. The spray pattern is enhanced, flow across the wafers is more uniform, and contaminant particle counts are reduced. Increased etch uniformity and increased yield is also achieved.

Existing centrifugal processors may be retrofit with the improved spray system. The kit includes a chamber 14 with appropriate nozzle hole patterns, manifolds having one or more rows of nozzles, and plumbing lines and valves, for increasing the back pressure at the nozzles, from e.g., 20-30 or 25 psi to e.g., 40-60 or 50 psi.

Thus, a novel processor has been shown and described. Various changes and modifications may of course be made without departing from the spirit and scope of the invention. The invention, therefore, should not be limited, except to the following claims, and their equivalents.

The invention claimed is:

1. A workpiece processing machine, comprising:
a process chamber;
a rotor supportable in the process chamber and adapted to hold a batch of substantially flat and evenly spaced apart workpieces for rotation in the process chamber about a spin axis oriented substantially perpendicular to the workpieces;
a motor linked to the rotor;
a first array of spray nozzles in the chamber adapted to spray a fluid toward the rotor;
a second array of spray nozzles in the chamber adapted to spray a fluid toward the rotor, with the second array of spray nozzles radially and longitudinally offset from the first array of spray nozzles, and with the first and second arrays of spray nozzles fixed in position relative to the rotor;
a liquid source connected to the first array of spray nozzles; and
with the spray nozzles positioned so that substantially each workpiece is sprayed on both sides.

2. The machine of claim 1 wherein the nozzles in the first and second array are evenly spaced apart in a longitudinal direction.

3. The machine of claim 1 wherein the first and second arrays of spray nozzles produce first and second spray patterns of fluid, with the first spray pattern overlapping with the second spray pattern and with the first spray pattern oriented at an acute angle to the second spray pattern.

4. The machine of claim 1 with first and second arrays of spray nozzles attached to first and second spray manifolds.

5. The machine of claim 1 further comprising a drain trough in the chamber, with the second array of spray nozzles positioned 160-200 degrees away from the drain trough.

6. The machine of claim 1 wherein the first and second arrays of spray nozzles extend for a length greater than the length of the rotor.

7. The machine of claim 1 with the rotor inclined at an angle of from about 5-30° from horizontal.

8. The machine of claim 1 with the first array of spray nozzles spaced radially apart from the second array of spray nozzles by about 5-30 degrees.

9. The machine of claim 1 with the first and second spray nozzles clustered together.

10. The machine of claim 9 further comprising a third array of spray nozzles spaced apart from the second array of spray nozzles.

11. The processing machine of claim 1 with the workpieces substantially parallel to each other and with the nozzles spraying fluid at the edges of the workpieces.

12. A flat disk workpiece processing machine, comprising:
a process chamber;
a rotor in the process chamber adapted to hold a batch of flat disk workpieces substantially evenly spaced apart and parallel to each other;
a first pattern of spray nozzles in the chamber, with the first pattern having a first column and a second column of spray nozzles, and with the first column adjacent to and longitudinally offset from the second column;
a second pattern of spray nozzles in the chamber, with the second pattern spaced apart from the first pattern, and the second pattern having a third column and a fourth column of spray nozzles, and with the third column adjacent to and longitudinally offset from the fourth column;
the first and second patterns of spray nozzles fixed in position relative to the rotor, and with at least two nozzles in the first and second patterns of spray nozzles positioned to spray substantially each flat disk workpiece on both sides; and
a process chemical source connected to one or both of the first and second patterns of spray nozzles, with the process chemical source supplying de-ionized water, nitrogen gas, carbon dioxide gas, an acid or a solvent, to the spray nozzles.

13. The processing machine of claim 12 with the spray nozzles in the first column longitudinally offset from the spray nozzles in the second column.

14. The processing machine of claim 12 with the second pattern substantially the same as, or substantially a mirror image of, the first pattern.

15. The processing machine of claim 12 with first column substantially parallel to the second column.

16. A flat wafer processing machine, comprising:
a process chamber;
a rotor supportable in the process chamber and adapted to hold an array of spaced apart flat wafers and to rotate the wafers about a rotation axis substantially perpendicular to a plane of each wafer;
a first array of spray nozzles in the chamber adapted to spray a fluid toward the edges of the wafers;
a second array of spray nozzles in the chamber adapted to spray a fluid toward the edges of the wafers, with the second array of spray nozzles radially and longitudinally offset from the first array of spray nozzles;
and with the first and second array of spray nozzles fixed in position relative to the rotor.

17. A spray processing machine for processing a batch of semiconductor wafers, comprising:
a process chamber;
a rotor in the process chamber adapted for holding the batch of semiconductor wafers substantially parallel and equally spaced apart from each other, for rotation of the workpieces in the process chamber about a rotor axis;
first and second groups of spray nozzles adjacent to a top position of the chamber and adapted to spray a fluid through the rotor and onto a batch of workpieces held within the rotor;
with the second group of spray nozzles longitudinally offset from the first group of spray nozzles, and with the first and second groups of nozzles oriented to spray fluid between the wafers and at an acute angle to the wafers, and with the first and second groups of spray nozzles fixed in position relative to the rotor;
a drain in the process chamber adjacent to a bottom of the process chamber; and
a fluid supply connected to at least one of the first and second groups of spray nozzles.

18. The machine of claim 17 wherein the second and third arrays of spray nozzles are radially spaced apart by 25-90 degrees.

19. The processing machine of claim 17 further comprising third and fourth groups of spray nozzles radially and longitudinally offset from each other, and with the second group closer to the first group than to the third group.

20. The processing machine of claim 19 with the first and second groups of spray nozzles located on a first side of a spin axis of the rotor, adjacent to a top position of the chamber, and with the third and fourth groups of spray nozzles located on a second side of the spin axis of the rotor, opposite from the first side, and adjacent to a top position of the chamber.

21. The processing machine of claim 17 wherein the rotor axis is upwardly inclined.

22. The processing machine of claim 17 wherein the second array of spray nozzles is radially offset from the first array of spray nozzles.

23. The processing machine of claim 17 wherein:
the first group of nozzles has a first column and a second column of spray nozzles, and with the first column adjacent to the second column, and
the second group of spray nozzles has a third column and a fourth column of spray nozzles, and with the third column adjacent to the fourth column; and
the first and second groups of spray nozzles fixed in position relative to the rotor.

24. A spray processing machine for processing a batch of semiconductor wafers, comprising:
a process chamber;
a rotor in the process chamber adapted for holding the batch of semiconductor wafers substantially parallel and equally spaced apart from each other, for rotation of the workpieces in the process chamber about a rotor axis;
first and second groups of spray nozzles located on a first side of a spin axis of the rotor, adjacent to a top position of the chamber and adapted to spray a fluid through the rotor and onto a batch of workpieces held within the rotor;
with the second group of spray nozzles longitudinally offset from the first group of spray nozzles, and with the first and second groups of nozzles oriented to spray fluid between the wafers and at an acute angle to the wafers;
third and fourth groups of spray nozzles radially and longitudinally offset from each other, and with the second group of spray nozzles closer to the first group of spray nozzles than to the third group of spray nozzles, and with the third and fourth groups of spray nozzles located on a second side of the spin axis of the rotor, opposite from the first side, and adjacent to a top position of the chamber;
a drain in the process chamber adjacent to a bottom of the process chamber; and
a fluid supply connected to at least one of the first and second groups of spray nozzles.

\* \* \* \* \*